(12) United States Patent
Ham et al.

(10) Patent No.: US 6,873,169 B1
(45) Date of Patent: Mar. 29, 2005

(54) CARRIER MODULE FOR SEMICONDUCTOR DEVICE TEST HANDLER

(75) Inventors: Chul Ho Ham, Gyeonggi-do (KR); Byoung Dae Lee, Gyeonggi-do (KR); Ho Keun Song, Gyeonggi-do (KR); Young Geun Park, Gyeonggi-do (KR)

(73) Assignee: Mirae Corporation, Chunan-si (KR)

( * ) Notice: Subject to any disclaimer, the term of this patent is extended or adjusted under 35 U.S.C. 154(b) by 19 days.

(21) Appl. No.: 10/797,072

(22) Filed: Mar. 11, 2004

(51) Int. Cl.[7] .............................................. G01R 31/02
(52) U.S. Cl. ..................... 324/755; 324/158.1; 324/758
(58) Field of Search .............................. 324/755, 158.1, 324/754, 758; 439/330, 331, 73, 329; 361/718, 704, 710; 165/80.1–80.4

(56) References Cited

U.S. PATENT DOCUMENTS

| | | | | |
|---|---|---|---|---|
| 6,512,388 B1 | * | 1/2003 | Satoh et al. ................. | 324/755 |
| 6,741,089 B2 | * | 5/2004 | Conroy ........................ | 324/755 |
| 6,752,645 B2 | * | 6/2004 | Nakamura et al. .......... | 439/330 |

* cited by examiner

Primary Examiner—David Zarneke
Assistant Examiner—Jimmy Nguyen
(74) Attorney, Agent, or Firm—Fleshner & Kim, LLP (57) ABSTRACT

Carrier module for a semiconductor device test handler including a carrier module body, a device seating part in an underside part of the carrier module body, at least one pair of first latches at opposite sides of the device seating part arranged opposite to, and movable away from, or close to, each other, for holding, or releasing opposite side parts of the semiconductor device seated on the device seating part, at least one pair of second latches rotatably fitted on opposite sides of the first latch, for holding an underside part of the semiconductor device seated on the device seating part, and releasing the semiconductor device interlocked with a releasing action of the first latch, a latch button fitted in an upper part of the carrier module to move in up/down directions and coupled to one end of the first latch, for moving up and down to make the first latch to move, and a first elastic member, and a second elastic member for elastic supporting of the first latch, and the second latch, thereby securely holding, transferring, and bringing the semiconductor device into contact with the test socket, for testing.

10 Claims, 13 Drawing Sheets

CARRIER MODULE FOR SEMICONDUCTOR DEVICE TEST HANDLER

BACKGROUND OF THE INVENTION

1. Field of the Invention

The present invention relates to carrier modules mounted on a test tray of a handler for testing semiconductor devices, and more particularly, to a carrier module for semiconductor device test handler for secure loading of a semiconductor device thereon, and easy connection to a test socket at a test site of the semiconductor device of a type in which leads, or balls are distributed even to a periphery of an underside of the semiconductor device, or very small BGA.

2. Background of the Related Art

In general, modular ICs, which are circuitry arrangements of memory or non-memory semiconductor devices on a board, are subjected to various tests after production before shipment.

In general, the handler, used for automatic test of semiconductor devices, and modular ICs, progresses the test with a process in which a worker loads a tray having semiconductors to be tested loaded thereon on a loading stacker of a handler, transfers the test treys having the semiconductor devices loaded thereon to a test site, electrically connects lead or ball parts of the semiconductor devices to connectors of the test sockets, carries out required tests, separates the semiconductor devices from the test tray, classifies the semiconductor devices according to a result of the test, and loads on user trays on an unloading stacker.

Figure 1:
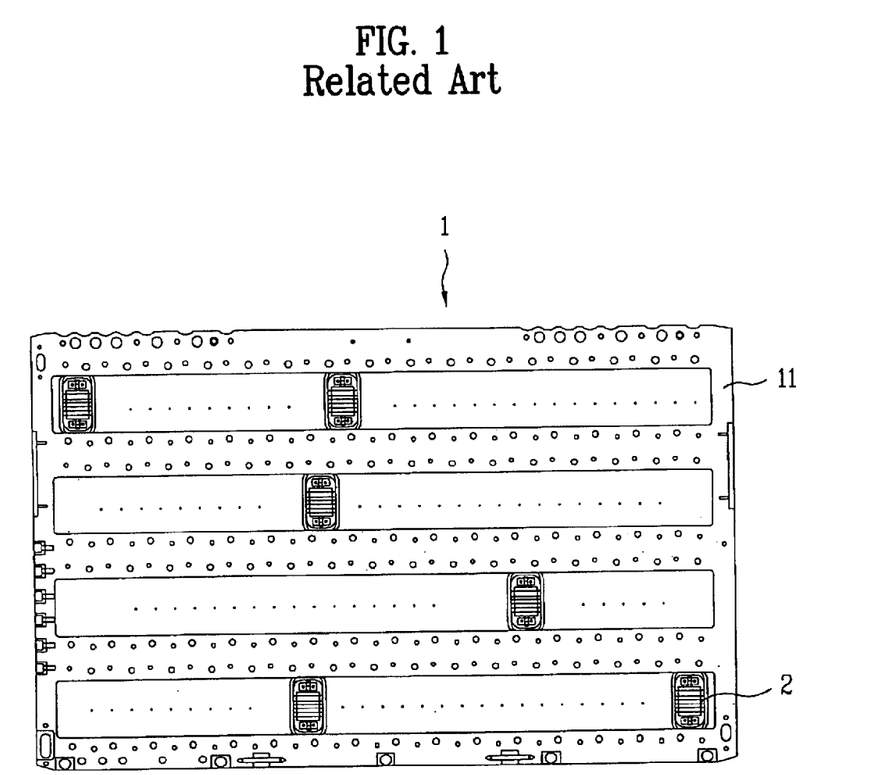
FIG. 1 illustrates a front view of a test tray having related art carrier modules mounted thereon.
Figure 2:
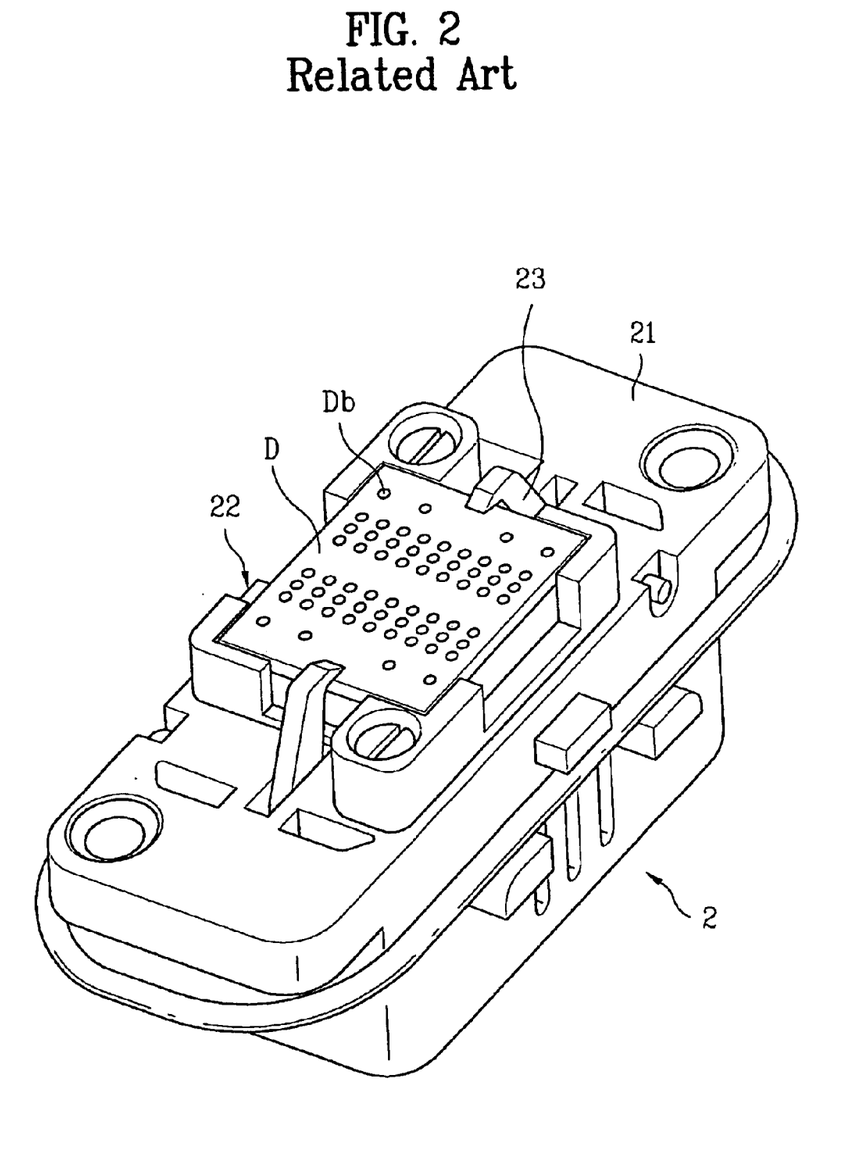
FIG. 2 illustrates a bottom perspective view of a related art carrier module.

FIG. 1 illustrates a front view of a test tray having carrier modules mounted thereon schematically, and FIG. 2 illustrates a perspective view of a related art carrier module.

Referring to FIG. 1, the related art test tray 1 is provided with a plurality of carrier modules 2 mounted on a metal frame 11 at regular intervals, for loading the semiconductor devices thereon.

Referring to FIG. 2, the carrier module 2 is provided with a seating part 22 on a hexahedral body 21 for seating the semiconductor device 'D' thereon, and one pair of latches 23 at opposite sides of the seating part 22 for holding the semiconductor device 'D'.

The latches 23 rotate around hinge shafts (not shown) inside of the body 21 respectively, to open or close the seating part 22, and hold opposite edges having no balls formed thereon of the semiconductor device 'D' seated on the seating part 22.

Referring to FIG. 2, the related art carrier module 2 has the semiconductor device 'D' seated thereon with a ball formed surface thereof faced upward. When the test tray 1 having the semiconductor device 'D' seated thereon thus is transferred to a test site of the handler, the index unit on the test site pushes the carrier module 2 toward the test socket, so that the balls Db of the semiconductor device 'D' are brought into contact with terminal pins (not shown) of the socket, to enable the test.

However, though the related art carrier module 2 can hold the semiconductor device 'D' adequately with the latches 23 when the semiconductor device 'D' has many parts no balls Db or leads (not shown) are formed therein, as the recent semiconductor device development trend shows, the related art carrier module 2 can not have the semiconductor device 'D' mounted thereon in a case the balls or the leads are distributed over an entire periphery of an underside of the semiconductor device 'D', or the semiconductor device 'D' is very small, when parts for holding the semiconductor device with the latches 23 can not be secured adequately, actually.

SUMMARY OF THE INVENTION

Accordingly, the present invention is directed to a carrier module for semiconductor device test handler that substantially obviates one or more of the problems due to limitations and disadvantages of the related art.

An object of the present invention is to provide a carrier module for semiconductor device test handler, which enables, not only secure holding and transfer, but also stable connection to a test socket and test, of the semiconductor device, even in a case a size of the semiconductor device is very small, or leads or balls of the semiconductor device of a type of MCF (Micro Lead Frame) or QFN (Quad Flat No-lead), or BGA developed recently are distributed on an entire area, or edge of the device.

Other object of the present invention is to provide a carrier module for semiconductor device test handler, which enables, not only secure holding and transfer, but also stable connection to a test socket and test, of the semiconductor device, even in a case a thickness of the semiconductor device is very thin.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the carrier module for a semiconductor device test handler includes a carrier module body, a device seating part in an underside part of the carrier module body, at least one pair of first latches at opposite sides of the device seating part arranged opposite to, and movable away from, or close to, each other, for holding, or releasing opposite side parts of the semiconductor device seated on the device seating part, at least one pair of second latches rotatably fitted on opposite sides of the first latch, for holding an underside part of the semiconductor device seated on the device seating part, and releasing the semiconductor device interlocked with a releasing action of the first latch, a latch button fitted in an upper part of the carrier module to move in up/down directions and coupled to one end of the first latch, for moving up and down to make the first latch to move, and a first elastic member, and a second elastic member for elastic supporting of the first latch, and the second latch.

The carrier module further includes projections from opposite sides of a lower part of the second latch, and latch pushers projected upward from opposite side parts of a test socket, to which the semiconductor device is brought into electric contact, and at which the semiconductor device is tested, opposite to the projections, thereby, when the semiconductor device on the device seating part is brought into contact with the test socket, the projection of the second latch comes into contact with the latch pusher, to rotate the second latch outward, to release the holding on the semiconductor device by the second latch.

The carrier module further includes a plurality of tips extended from a fore end of the first latch between adjacent leads or balls on the semiconductor device, for supporting the underside edge of the semiconductor device.

Thus, the present invention permits to progress the test smoothly as the first latch and the second latch hold the semiconductor device at the same time when the carrier module has the semiconductor device held on therein, and only the second latch rotates outwardly to release the semiconductor device in a state the first latches hold opposite side parts of the semiconductor device in a case the semiconductor device is brought into contact with the test socket, and the test is carried out, and, when it is required that the carrier module is to remove, or receive the semiconductor device, the first latch and second latch move apart at the same time, to discharge the semiconductor device, fully.

It is to be understood that both the foregoing description and the following detailed description of the present invention are exemplary and explanatory and are intended to provide farther explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 3:
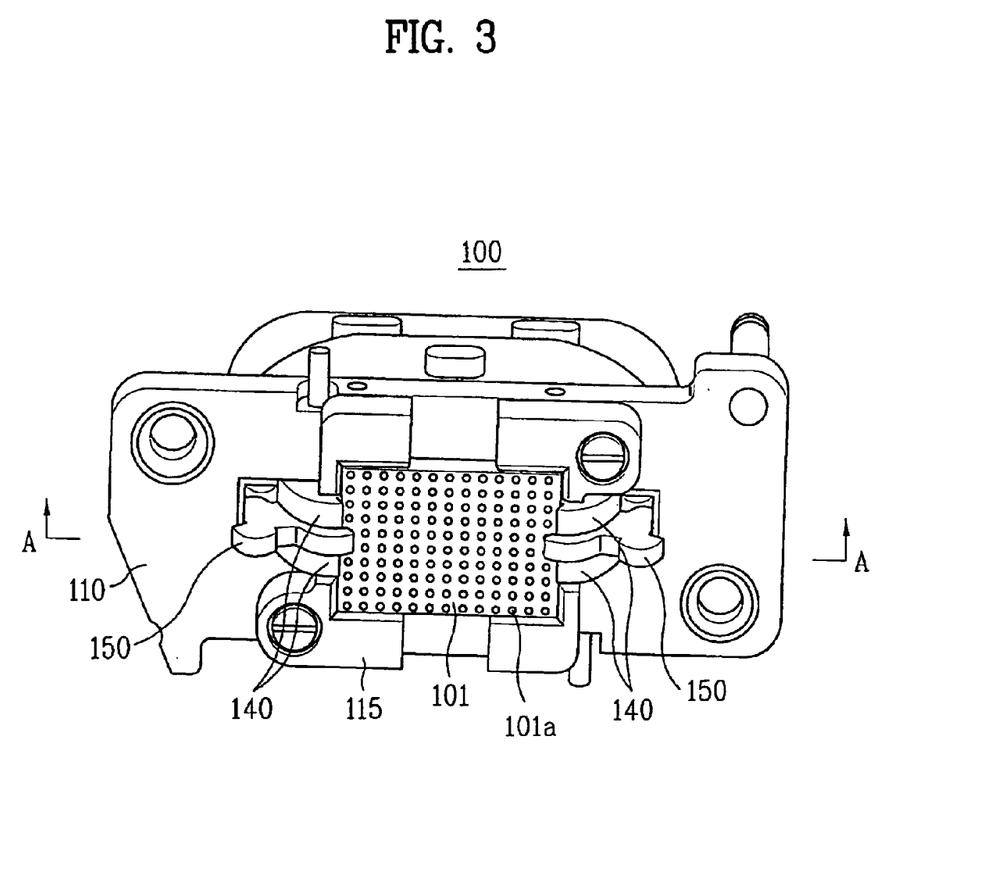
FIG. 3 illustrates a bottom perspective view of a carrier module in accordance with a preferred embodiment of the present invention.
Figure 4A:
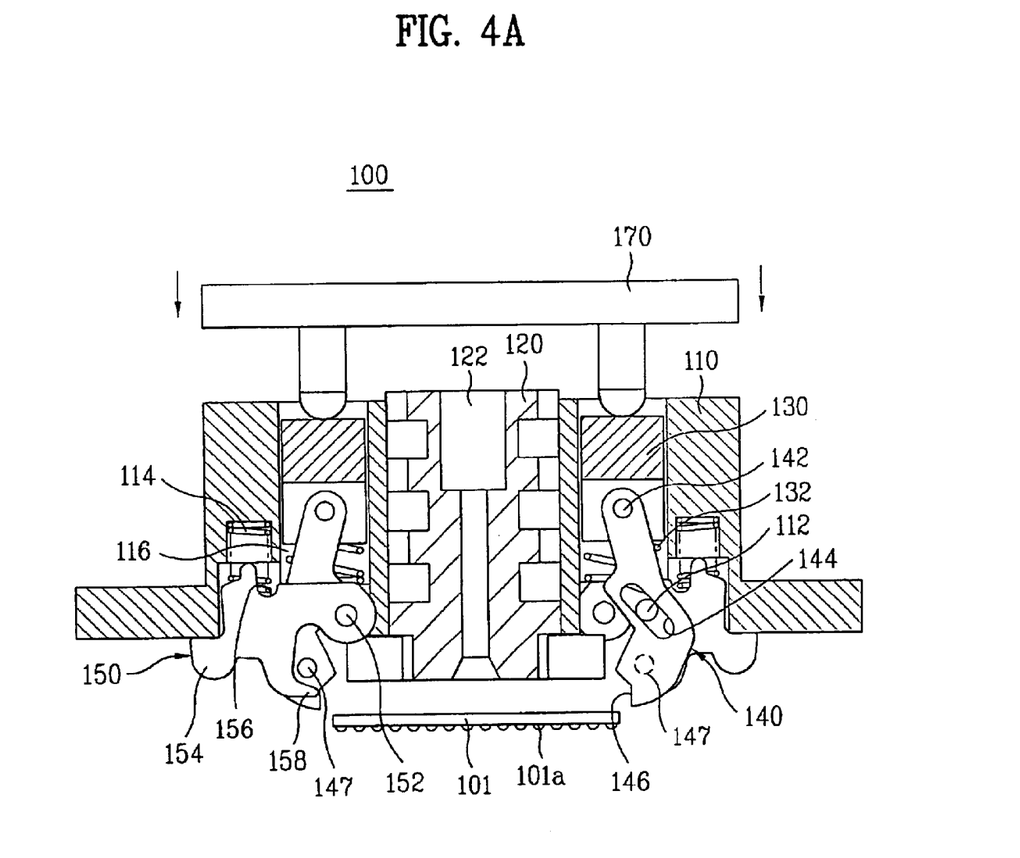
FIGS. 4A–4C illustrate sections across a line A—A each showing an operation example of the carrier module in FIG. 3.
Figure 4B:
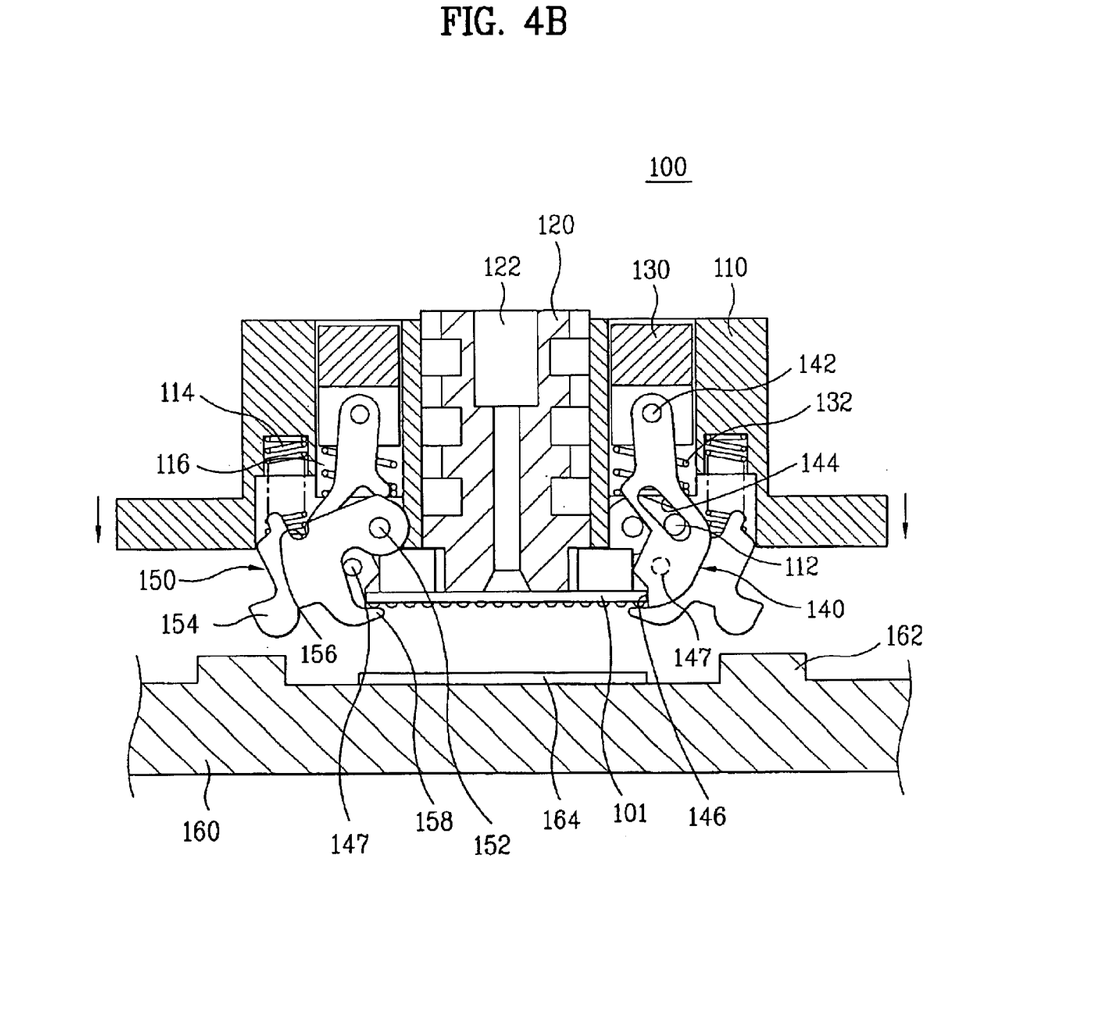
Figure 4C:
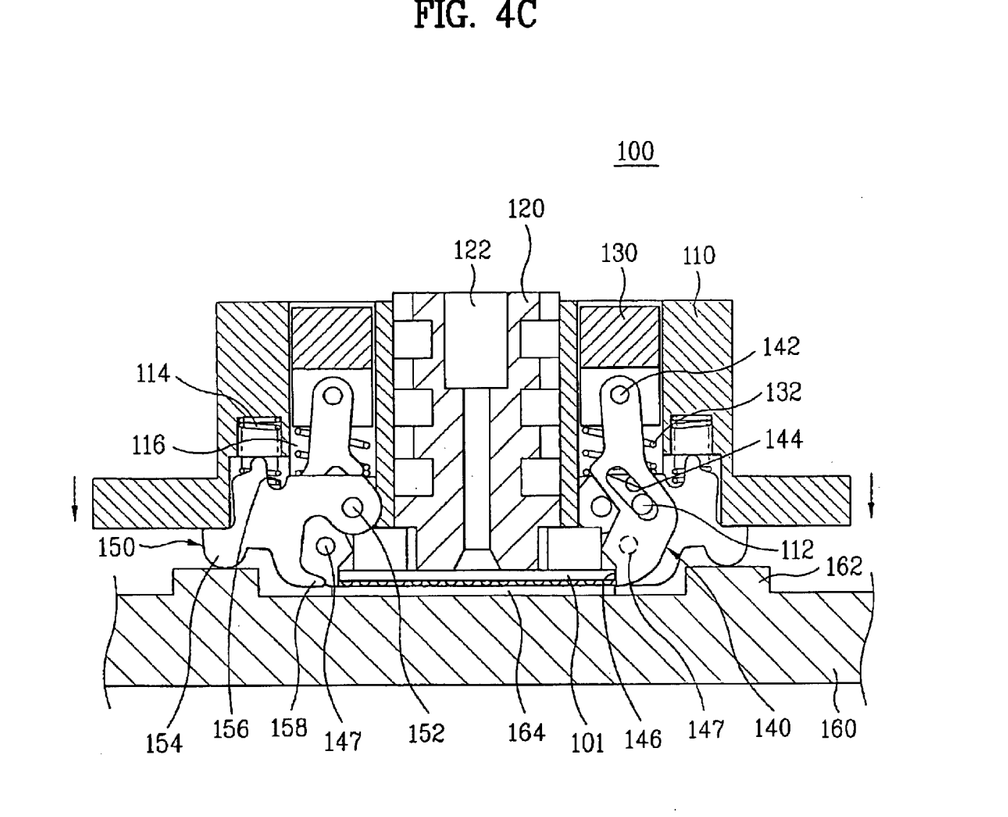

FIGS. 3 to 4C illustrate a carrier module of a semiconductor device test handler in accordance with a preferred embodiment of the present invention, wherein the carrier module 100 includes a carrier module body 110, a device seating part 115 in a central part of an underside of the carrier module body 110 for seating the semiconductor device, a first latch 140, and a second latch 150 at opposite sides of the device seating part 115 for respectively holding opposite sides and an underside of the semiconductor device 101, and a latch button 130 movably fitted in an upper part of the carrier module body 110 for moving the first latch 130 in up/down directions.

The first latch 140 is rotatably coupled to the latch button 130 with the first connection pin 142, and the second latch 150 is rotatably coupled to the carrier module body 110 with a second connection pin 152.

There are one pair of second latches 150, and two pairs of first latches 140 on opposite sides of the second latches 150.

The device seating part 115 is separable from the carrier module body 110, and replaceable with other one depending on form and size of the semiconductor device 101.

There is a heat sink 120 in a central part of the carrier module body 110 for suppressing temperature rise of the semiconductor device, and the heat sink 120 has a vertical pass through hole 122 in a central part thereof.

Each of the latch buttons 130 has a lower end elastically supported on a carrier module body 110 by a first compression spring 132 in a state the latch buttons 130 are inserted in holes 116 on opposite sides of the heat sink 120.

The first latch 140 has a slanted guide slot 144 of a long hole form in a central part, and there is a guide pin 112 fixed to the carrier module body 110 and positioned in the guide slot 144.

According to this, if an external force is applied to the latch button 130 to move down the latch button 130, the guide slot 144 is guided by the guide pin 112 such that the first latch 140 moves outward in a diagonal direction, to move down outwardly, and opposite to this, if the external force applied to the latch button 130 is removed, the latch button 130 moves up by the elastic force of the first compression spring 132, and according to this, the guide slot 144 of the first latch 140 is guided by the guide pin 112, such that the first latch 140 moves up inward in a diagonal direction, to move up inwardly.

Moreover, there are latch moving pieces 147 projected from opposite sides of the first latch 140 so as to be in contact with an inside surface of the second latch 150.

In the meantime, the second latch 150 has a recess 156 in an outer upper part, in which one end of the second compression spring 114 is held to support the carrier module body 110, elastically. The second latch 150 has a projection 158 from an inner side of a lower part of the second latch 150 toward the underside of the semiconductor device 101, and a projection 154 from an outer side of the lower part to downward, to press the projection 154 when it is intended to rotate the second latch 150 around the second connection pin 152.

The operation of the carrier module of the present invention will be described.

Referring to FIG. 4A, when the semiconductor device 101 to be tested is conveyed to a place under the carrier module 100 of the test tray 1 (see FIG. 1) by a device conveyer (not shown), the push member 170 moves down from above the carrier module 100, and presses the latch button 130.

When the pusher member 170 pushes down the latch button 130, as described before, the first latch 140 moves down in a diagonal outward direction to move outward guided by the guide pin 112. At the same time with this, as the first latch 140 moves outward, since the latch moving piece 147 pushes away an inside surface of the second latch 150, the second latch 150 rotates outward, to move away.

Thus, once the first latch 140 and the second latch 150 move away from each other, a lower pusher member (not shown) under the carrier module 100 pushes up the semiconductor device 101, and seats on the device seating part 115.

If the semiconductor device 101 seats on the device seating part 115, as the pusher member 170 moves up, the latch button 130 moves up by the elastic force of the first compression spring 132, to move the first latch 140 in a diagonal inward direction to close, to hold opposite sides of the semiconductor device 101 as shown in FIG. 4B.

At the same time with this, as the first latch 140 moves up, the second latch 150 also rotates inwardly by the elastic force of the second compression spring 114, such that the projection 158 holds opposite underside of the semiconductor device 101.

When the test tray 1 (see FIG. 1) is transferred to a position of the test socket 160 at the test site in a state the semiconductor device 101 is held in the carrier module 100, a press unit (not shown) pushes the carrier module body 110 toward the test socket 160.

The test socket has latch pushers 162 projected upward from opposite side parts matched to the projection 154 of the second latch 150. As shown in FIG. 4C, if the carrier module 100 moves toward the test socket 160, the projection 154 of the second latch 150 is brought into contact with the latch pusher 162, to rotate the second latch 150 outward, to open the second latch 150, and release the holding on the semiconductor device, only leaving the first latch 140 to hold the opposite side parts of the semiconductor device, and bringing the balls 101a of the semiconductor device 101 into contact with a contact part 164 of the test socket 160.

Upon finish of the test, the test tray moves to a position for unloading the semiconductor device, and, as described with reference to FIG. 4A, the pusher member 170 moves down again at the unloading position, to separate the semiconductor device 101 from the carrier module 100.

In the meantime, when the semiconductor device 101 is in contact with the test socket 160, and progresses an electrical performance test, since heat is discharged from the semiconductor device 101 to an outside through the heat sink 120 quickly, no additional device or time is required for discharge of heat, to reduce time and cost for testing.

Moreover, vacuum can be sensed through the pass through hole 122 in the central part of the heat sink 120, to determine if the carrier module 100 is in hold of the semiconductor device 101.

FIGS. 5 to 7C illustrates a carrier module in accordance with another preferred embodiment of the present invention, wherein the carrier module 200 includes a device seating part 215 in a central part of a carrier module body 210 for seating very small BGA semiconductor device 102, and each one pair of first latches 240, and second latches 250 at opposite sides of the device-seating part 215 in a diagonal direction, respectively.

Figure 5:
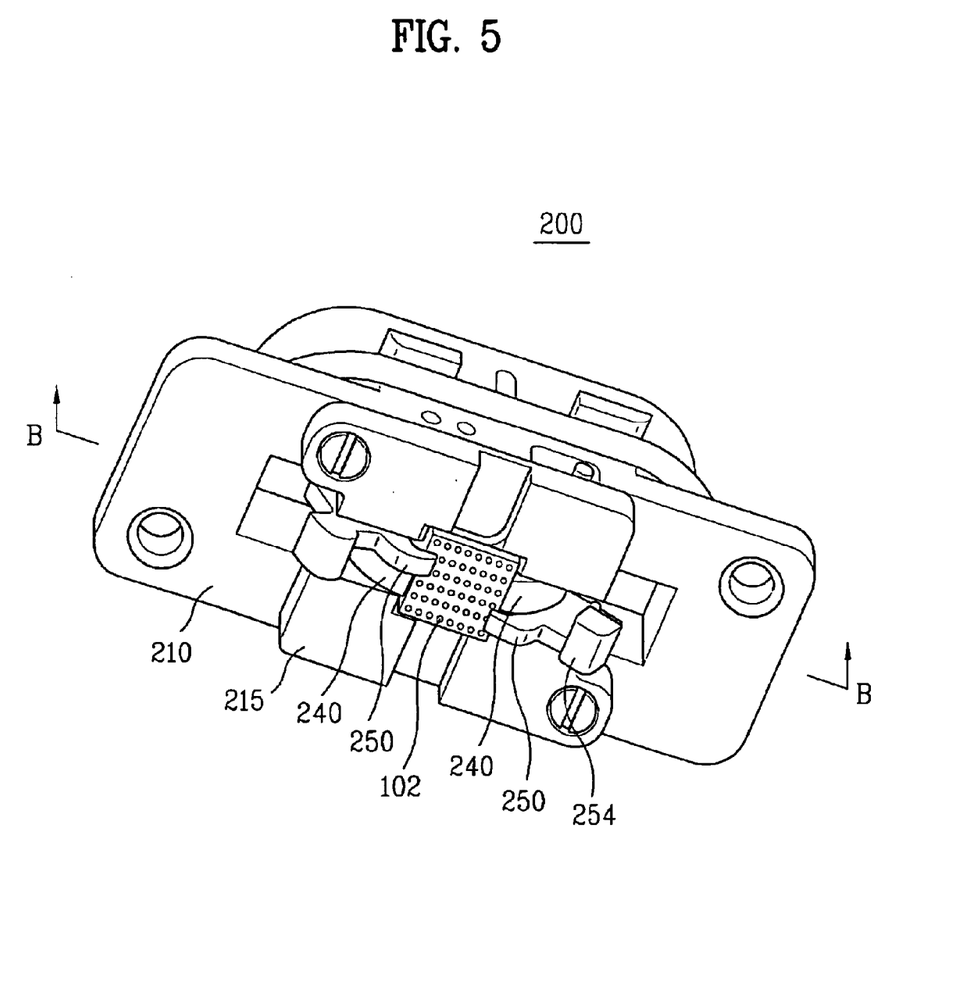
FIG. 5 illustrates a bottom perspective view of a carrier module in accordance with another preferred embodiment of the present invention.

Details structures of the first latches 240 and the second latches 250 are the same with the first, and second latches 140, and 150 of the foregoing embodiment, of which description will be omitted.

Since the carrier module 200 has the first latches 240 and the second latches 250 arranged in the diagonal direction to each other, the carrier module 200 can securely hold a small sized semiconductor device, effectively.

The operation of the carrier module 200 in accordance with another preferred embodiment of the present invention will be described.

Figure 6A:
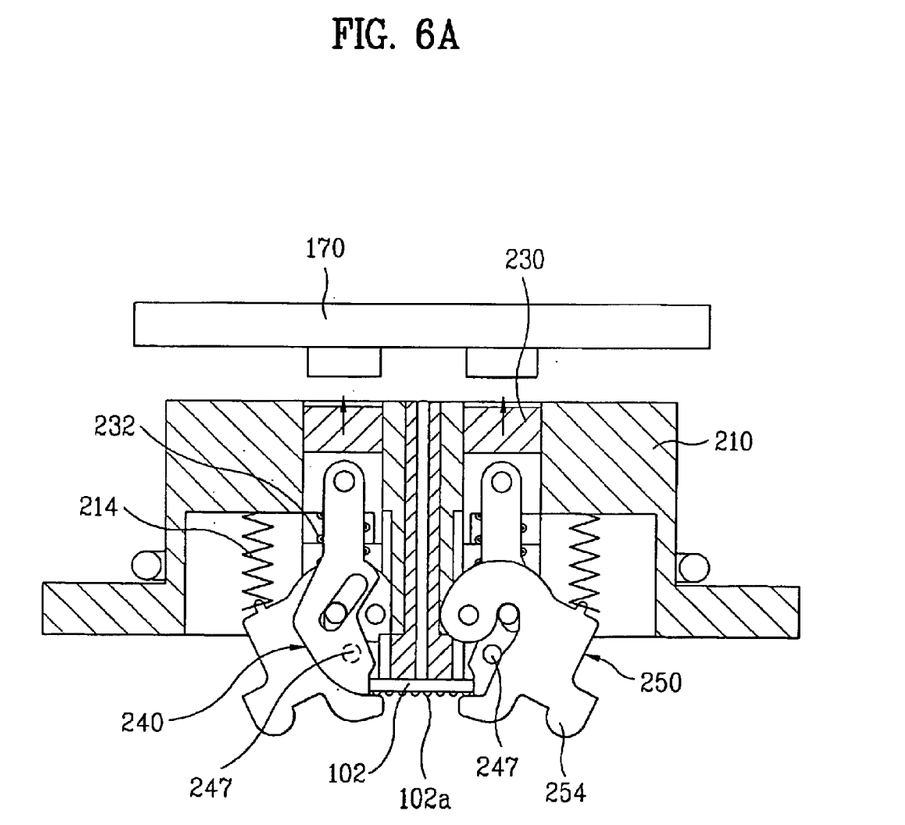
FIGS. 6A and 6B illustrate key part sections each showing an operation example of the carrier module in FIG. 5.

Referring to FIG. 6A, in a case the carrier module 200 receives, or discharges a semiconductor device 102, the pusher member 170 over the carrier module 200 moves down, and pushes the latch button 230. Then, the first latch 240 moves down in a diagonal outward direction to move open, and, at the same time with this, the second latch 250 also rotates outwardly by the latch moving piece 247 of the first latch 240, to move open, thereby making the carrier module 200 to be in a state to receive/discharge the semiconductor device 102 at/from the device seating part 215.

Figure 6B:
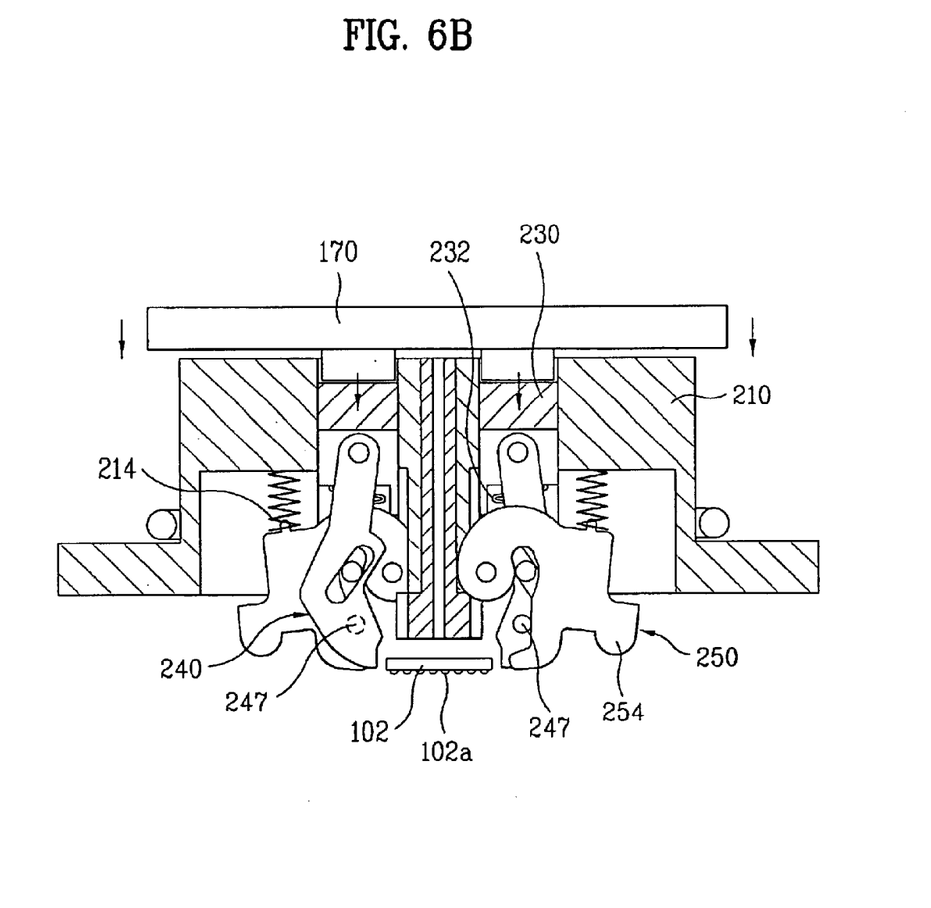

Referring to FIG. 6B, if the pusher member 170 moves up to free the latch button 130, the latch button 130 moves up by an elastic force of the first compression spring 232, and, according to this, the first latch 240 moves in a diagonal outward direction, to move close to hold the opposite sides of the semiconductor device 102 at diagonal positions. At the same time with this, as the first latch 240 moves up, the second latch 250 rotates inwardly by an elastic force of the second compression spring 214, to hold the opposite underside parts of the semiconductor device 102 at diagonal positions.

Figure 7A:
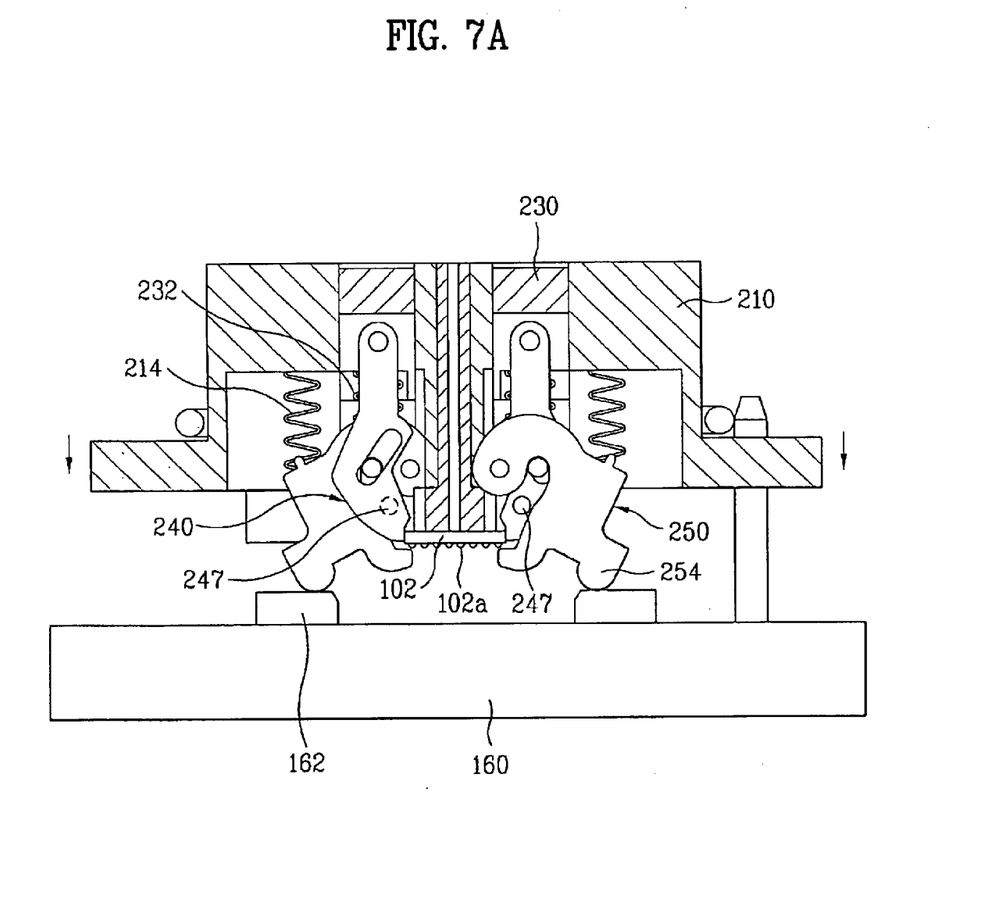
FIGS. 7A and 7B illustrate sections across a line B—B each showing operation when the carrier module in FIG. 5 connects a semiconductor device to a test socket.

In the meantime, referring to FIG. 7A, in a case the semiconductor device is brought into contact with the test socket and tested, if the semiconductor device 102 moves down in a state seated on the seating part 215, a projection 254 from the second latch 250 is brought into contact with a latch pusher 162 at opposite sides of the test socket 160.

Figure 7B:
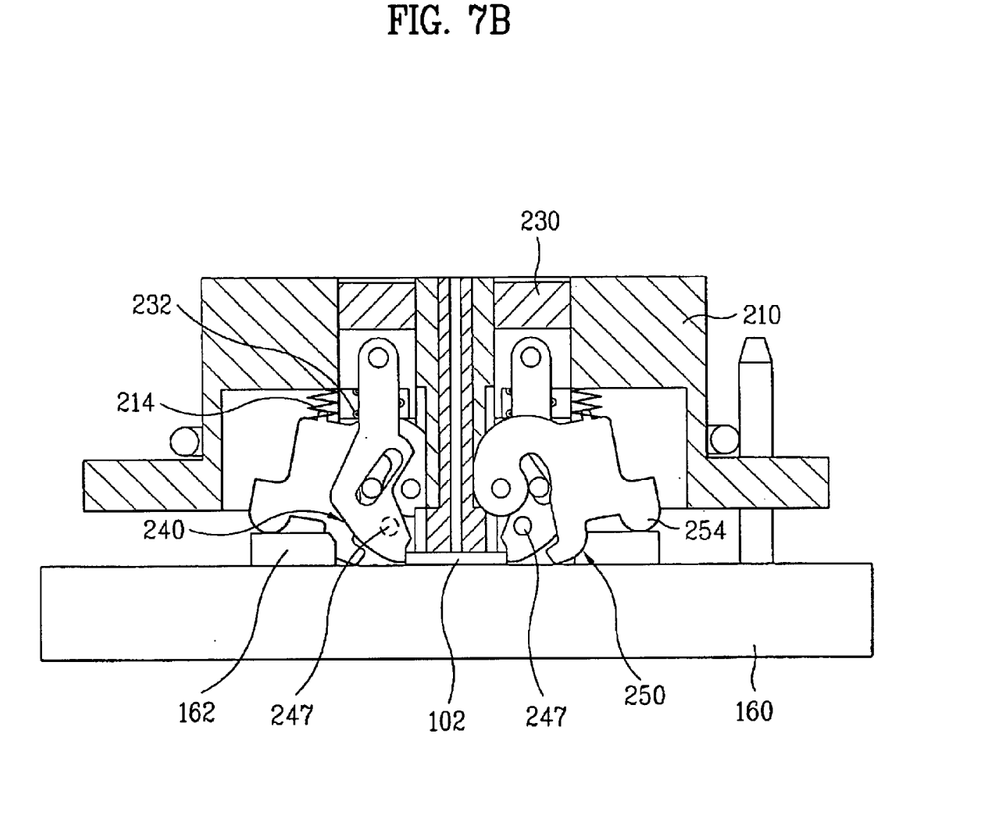

Referring to FIG. 7B, if the carrier module 200 is kept moving down under this state, the second latch 250 overcomes the elastic force of the second compression spring 214 to move open, and the semiconductor device 102 has the balls 102a brought into contact with the contact part 164 in a state the opposite side parts are held by the first latch 240 as before.

Upon finishing the test, the carrier module 200 moves to a predetermined unloading position, and the semiconductor device 210 is separated from the carrier module in a process described with reference to FIG. 6B.

Figure 8:
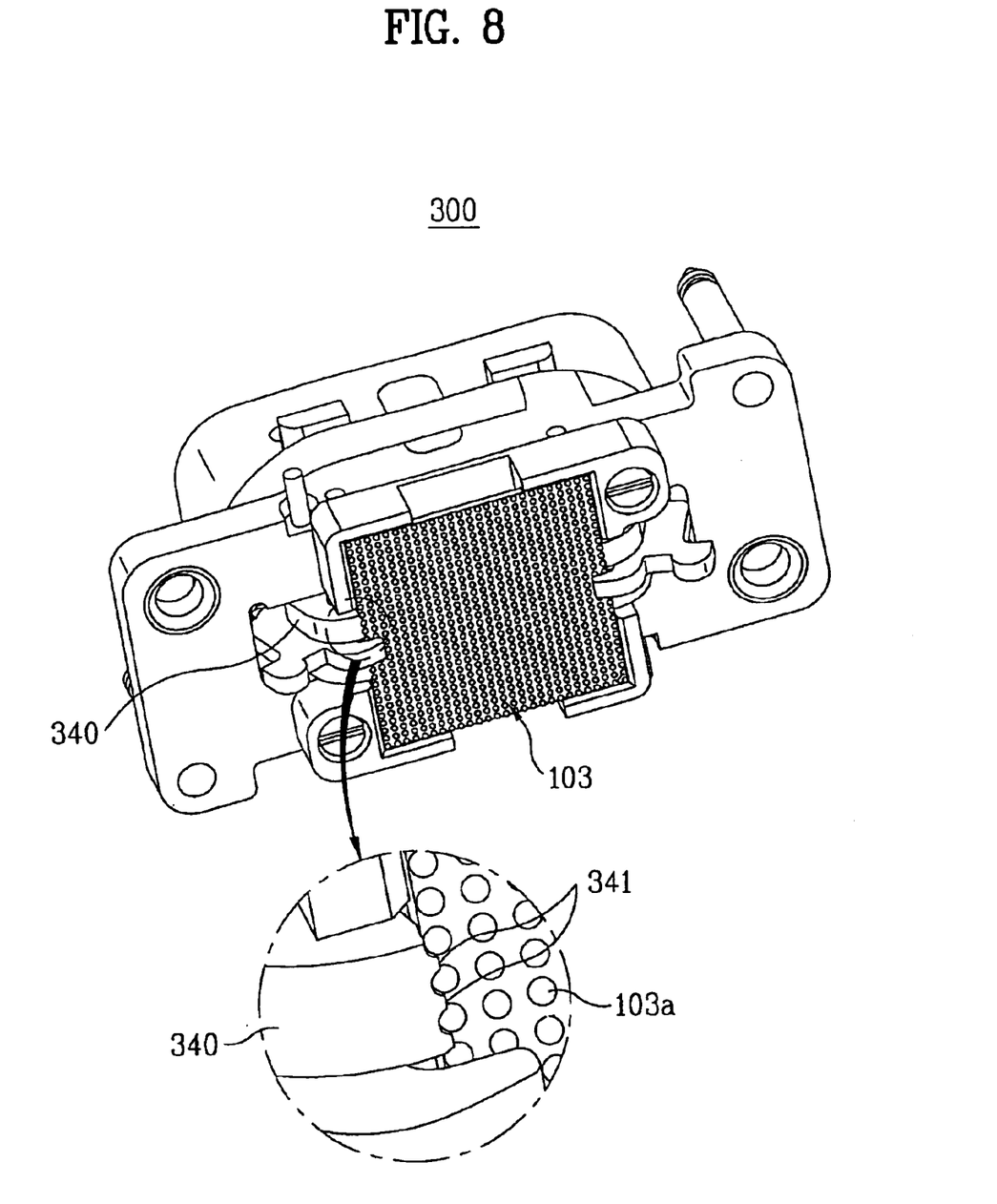
FIG. 8 illustrates a bottom perspective view of a carrier module in accordance with another preferred embodiment of the present invention.
Figure 9:
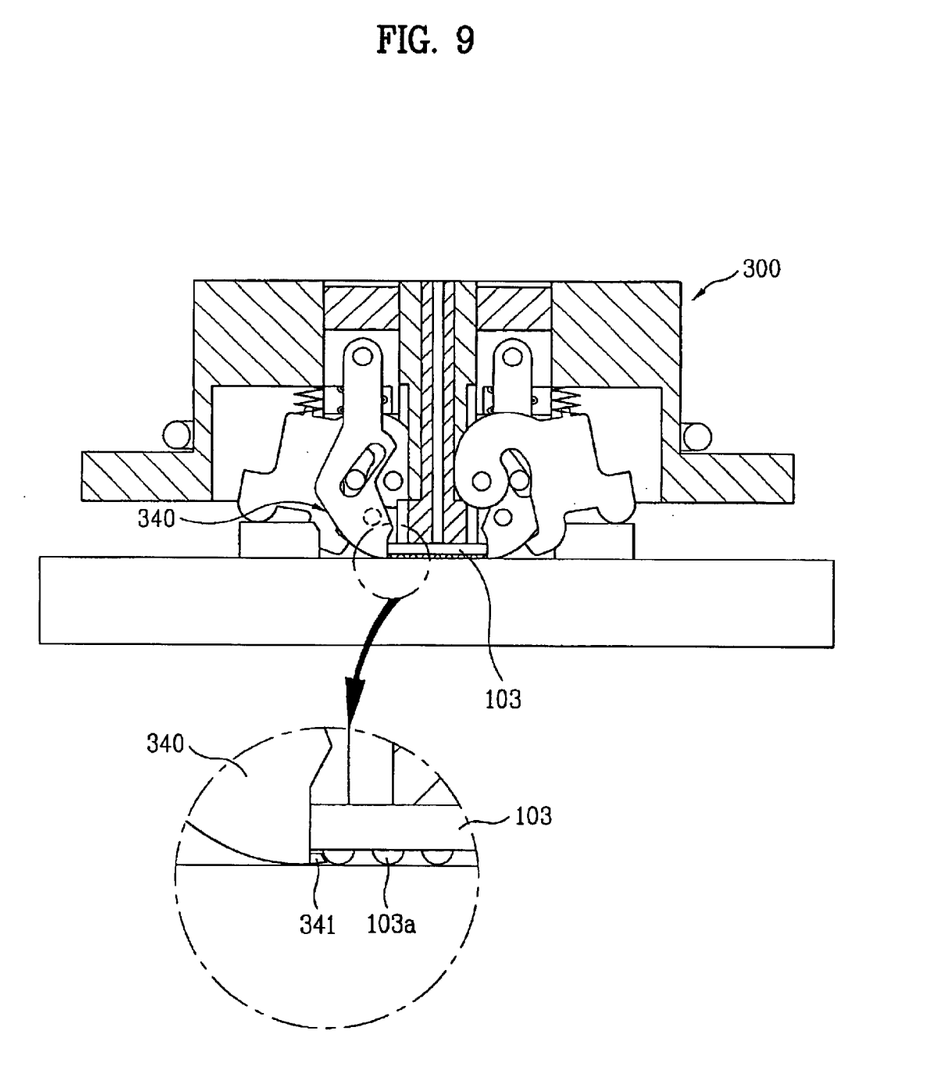
FIG. 9 illustrates a section of key parts of the carrier module in FIG. 8.

In the meantime, FIGS. 8 and 9 illustrate a carrier module in accordance with another preferred embodiment of the present invention, wherein the carrier module 300 includes a plurality of tips 341 from a fore end of the first latch 340 to be positions between adjacent balls 103a on the semiconductor device 103, so that the first latch 340 can hold the opposite sides and a part of an underside of the semiconductor device, for providing a more stable supporting force to a BGA semiconductor device, which is very thin, when the BGA semiconductor device is brought into contact with the test socket.

Of course, it is required that the tip 341 has a thickness thinner than the ball 103a so that the balls 103a on the semiconductor device 103 can be brought into contact with the contact part 164 (see FIG. 4B), positively.

As has been described, the secure holding and bringing into contact with the test socket of the semiconductor device having leads or balls distributed on an entire edge area of the semiconductor device permits to improve test reliability.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A carrier module for a semiconductor device test handler comprising:
   a carrier module body;

a device seating part in an underside part of the carrier module body;

at least one pair of first latches at opposite sides of the device seating part arranged opposite to, and movable away from, or close to, each other, for holding, or releasing opposite side parts of the semiconductor device seated on the device seating part;

at least one pair of second latches rotatably fitted on opposite sides of the first latch, for holding an underside part of the semiconductor device seated on the device seating part, and releasing the semiconductor device interlocked with a releasing action of the first latch;

a latch button fitted in an upper part of the carrier module to move in up/down directions and coupled to one end of the first latch, for moving up and down to make the first latch to move; and a first elastic member, and a second elastic member for elastic supporting of the first latch, and the second latch.

2. The carrier module as claimed in claim 1, further comprising:

projections from opposite sides of a lower part of the second latch; and latch pushers projected upward from opposite side parts of a test socket, to which the semiconductor device is brought into electric contact, and at which the semiconductor device is tested, opposite to the projections, thereby, when the semiconductor device on the device seating part is brought into contact with the test socket, the projection of the second latch comes into contact with the latch pusher, to rotate the second latch outward, to release the holding on the semiconductor device by the second latch.

3. The carrier module as claimed in claim 1, further comprising a plurality of tips extended from a fore end of the first latch between adjacent leads or balls on the semiconductor device, for supporting the underside edge of the semiconductor device.

4. The carrier module as claimed in claim 2, further comprising a plurality of supplementary tips extended from a fore end of the first latch between adjacent leads or balls on the semiconductor device, for supporting the underside edge of the semiconductor device.

5. The carrier module as claimed in claim 1, wherein the one end of the first latch is rotatably coupled to the latch button with a connection pin.

6. The carrier module as claimed in claim 5, further comprising:

a slanted guide slot of a long hole form in a central part in the first latch, and a guide pin fixed to the carrier module body so as to be inserted in the guide slot for guiding movement of the first latch.

7. The carrier module as claimed in claim 1, further comprising a latch moving piece projected from the first latch so as to contact with an inside surface of the second latch, to rotate the second latch outward to release the semiconductor device when the first latch moves away and releases the semiconductor device.

8. The carrier module as claimed in claim 6, further comprising a latch moving piece projected from the first latch so as to contact with an inside surface of the second latch, to rotate the second latch outward to release the semiconductor device when the first latch moves away and releases the semiconductor device.

9. The carrier module as claimed in claim 1, wherein two pairs of the first latches are arranged on opposite sides of the second latch.

10. The carrier module as claimed in claim 1, wherein the first latch, and the second latch are arranged in diagonal directions to each other, respectively.

* * * * *